Figure 1:
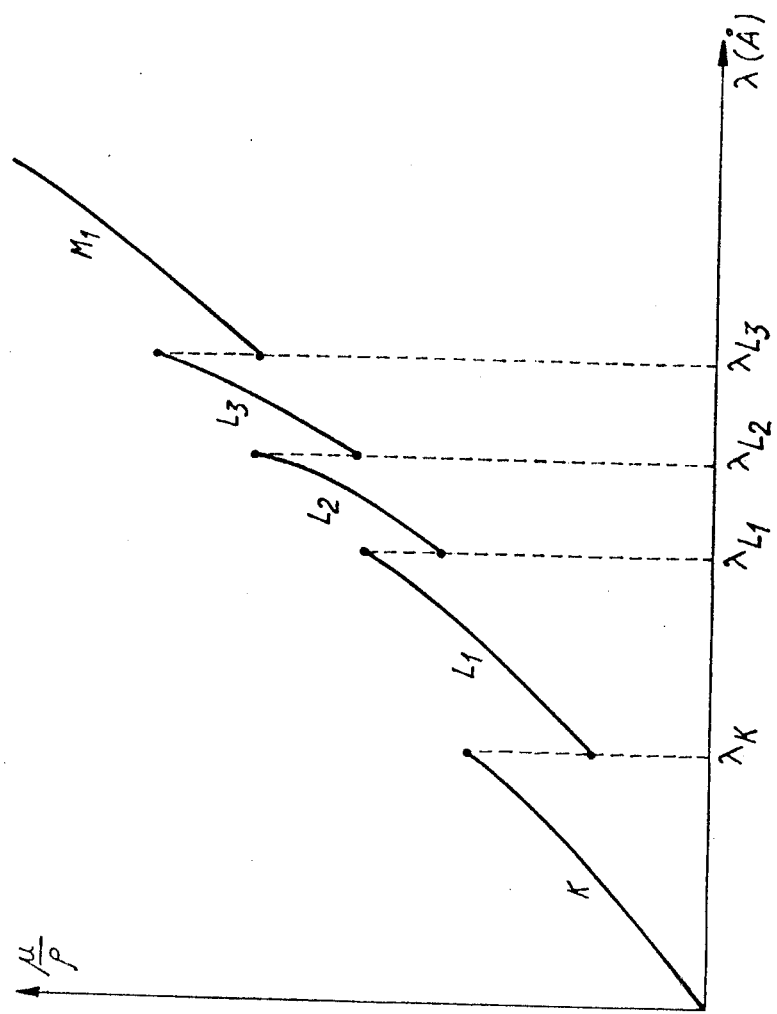

United States Patent [19]

Eranian et al.

[11] 4,268,590
[45] May 19, 1981

[54] PHOTOMASKING COMPOSITION, PROCESS FOR PREPARING SAME AND MASK OBTAINED

[75] Inventors: Armand Eranian; Jean C. Dubois; André Couttet; Evelyne Datamanti, all of Paris, France

[73] Assignee: Thomson-CSF, Paris, France

[21] Appl. No.: 127,745

[22] Filed: Mar. 6, 1980

[30] Foreign Application Priority Data

Mar. 9, 1979 [FR] France ................ 79 06136

[51] Int. Cl.³ .............................................. G03C 1/68
[52] U.S. Cl. ..................................... 430/5; 430/270; 430/296; 430/326; 204/159.22; 526/245; 426/292
[58] Field of Search .................. 430/5, 296, 326, 329, 430/270; 204/159.14, 159.22; 526/245, 292

[56] References Cited

U.S. PATENT DOCUMENTS

| | | | |
|---|---|---|---|
| 3,779,806 | 12/1973 | Gipstein et al. | 430/326 |
| 3,931,435 | 1/1976 | Gipstein et al. | 430/296 |
| 3,934,057 | 1/1976 | Moreau et al. | 430/329 |
| 4,051,271 | 9/1977 | Fujishige | 430/329 |
| 4,061,832 | 12/1977 | Roberts | 430/296 |
| 4,087,569 | 5/1978 | Hatzakis | 430/296 |
| 4,156,745 | 5/1979 | Hatzakis et al. | 430/296 |

*Primary Examiner*—Jack P. Brammer
*Attorney, Agent, or Firm*—Oblon, Fisher, Spivak, McClelland & Maier

[57] ABSTRACT

The invention relates to resins used for manufacturing or reproducing masks in electronics.

The photomasking composition corresponds to the general formula:

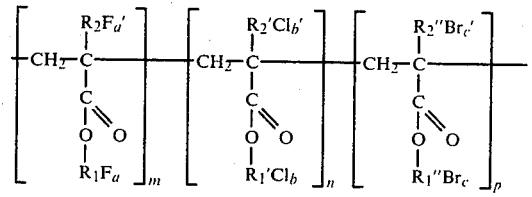

in which $R_1$, $R_1'$, $R_1''$, $R_2$, $R_2'$, $R_2''$ designate alkyl radicals whose principal chain contains from 1 to 10 carbon atoms, the symbols F, Cl and Br which designate the fluorine, chlorine and the bromine bearing indices a, b, c, a', b', and c' representing the number of these atoms which are zero or positive whole numbers, such as m, n, p.

17 Claims, 1 Drawing Figure

PHOTOMASKING COMPOSITION, PROCESS FOR PREPARING SAME AND MASK OBTAINED

FIELD OF THE INVENTION

The present invention relates to new resin or polymer compositions used as masking products for making manufacturing masks in microelectronics or in integrated optics for example. Although these resins and the masks obtained are generally called "photoresists", the invention relates to compositions degradable not only by means of photon beams (gamma rays, X-rays, far ultraviolet rays) but also by means of electron beams.

BACKGROUND OF THE INVENTION

The need to integrate more components on the same substrate involves the need to reduce the dimensions of the patterns represented on the masks, for the dimensions of the monocrystallin substrate cannot be increased very much, for reasons of crystallography and thermal dissipation outside the scope of the invention.

However, constructing high-resolution masks is no longer possible with visible light, whose wavelength is too great, which causes diffraction phenomena on the edges of the patterns of the masks and so poor definition. This is why it is necessary to use for irradiating masking products higher-definition rays, such as gamma rays, X-rays and far ultraviolet rays or electron beams which enable high-resolution masks to be obtained having then greater accuracy in the fineness of the lines— not exceeding a micron in width.

Adaptation to new radiation involves for the masking products adapting their sensitivity to these radiations.

Furthermore, there exist two types of masking products. The "possitive" resins are degraded by radiation, whereas the "negative" resins are Cross-Linked this means that after exposure, an appropriate solvent dissolves the parts of the positive resins which have been exposed to the radiation but, on the contrary dissolves the parts of the negative resins which have not been exposed to radiation. In fact, positive resins are more widely used for obtaining high resolution for their contrast is generally higher than that of the negative resins.

The invention relates then to positive polymer compositions degradable under the action of photons and electrons as well as the process for manufacturing same.

Positive polymer compositions sensitive to photons and electrons are known, such as methyl polymethacrylate, but their sensitivity to different types of photonic and electronic radiation is variable and depends on the corresponding energy absorbed.

For example, insofar as the action of X-rays are concerned, the positive polymer compositions, forming the subject matter of the invention, are more sensitive in a wider range of wavelengths for their structure comprises a plurality of halogenated atoms which selectively absorb the energy in a plurality of spectral ranges, being thus Mutually complementary.

SUMMARY OF THE INVENTION

More precisely, the invention is formed by a photomasking composition degradable under the action of radiation, formed from α-alkylacrylic copolymers substituted by at least two types of halogen atoms, of the general formula

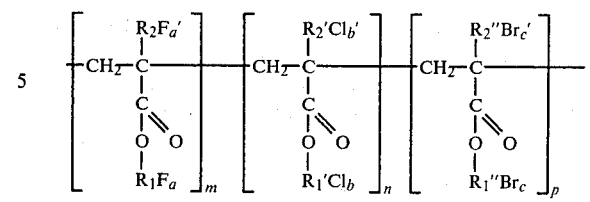

in which:

$R_1$, $R_1'$, $R_2''$, $R_2$, $R_2'$, $R_2''$ designate alkyl radicals whose principal chain contains 1 to 10 carbon atoms; these radicals being substituted by fluorine, chlorine, bromine whose indices a, a', b, b', c, c' are positive or zero whole numbers.

m, n, p designate whole numbers, equal to or greater than zero, a single one of the three numbers m, n, p being able to be equal to zero.

The invention will be better understood from the following description which refers to the accompanying FIGURE which shows the variation of the absorption coefficient per unit of mass with the wavelength.

DESCRIPTION OF THE INVENTION

The single FIGURE shows the typical curve of variation with wavelength λ, of the absorption coefficient per unit of mass, of radiation X by an atom. The absorption coefficient per unit of mass for an atom is expressed for each branch by the relationship $$(\mu/\rho) = C Z^3 \lambda^3$$

in which
$\mu$ is the linear absorption coefficient of the X-rays
$\rho$ is the voluminal mass
C is a constant
Z is the atomic number
λ is the wavelength This invention shows that the absorption is proportional to the cubes of the atomic number and of the wavelength, but FIG. 1 shows that the curve of variation is saw-toothed, composed of several branches. Each branch of the curve corresponds to an absorption range, which are known under the names of branches K, L, M. Thus, it appears that for one atom, the absorption at one wavelength is not automatically greater than at a lower wavelength, which causes the advantage of the cubic power of the wavelength to be lost. This is the case in particular, in the region of the discontinuities between different branches.

Furthermore, insofar as the absorption of X radiation, in particular soft X radiation (for example $4 < \lambda < 50$ Å), by a molecule is concerned, it appears as a weighted sum of the individual contributions of each atom making up the polymer.

Now, most usual polymers, in particular methyl polymethacrylate, are formed from light elements such as carbon, oxygen and hydrogen. The result is thaty absorb radiation less intensely, resulting in relatively low sensitivity.

French Pat. No. 2.339.184 reveals a new family of polymers degradable under the action of photons and electrons with higher sensitivity and contrast than those of methyl polymethacrylate. They are polymethacrylates halogenated, especially fluorinated, on the ester radical. The increase in sensitivity at certain wavelengths may be due to the presence of fluorine atoms more absorbing than carbon and oxygen at these wavelengths.

This solution presents nevertheless a major disadvantage. Because of the existence of absorption discontinuities which result in a sudden drop in absorption, it turns out that fluorine is not interesting in the whole range of soft X-rays between 4 and 50 Å, in particular just after passing from its absorption discontinuity K to 17.9 Å, as is shown in Table 1 below:

| Halogen | $\lambda_K$ (Å) | $\lambda_{LI}$ (Å) | $\lambda_{LII}$ (Å) | $\lambda_{LIII}$ (Å) | $\lambda_{MI}$ (Å) |
|---|---|---|---|---|---|
| Fluorine | 17.9 | — | — | — | — |
| Chloring | 4.4 | 52.1 | 61.4 | 61.7 | 417.8 |
| Bromine | 0.9 | 6.9 | 7.8 | 8.0 | 47.9 |

The incorporation, at the level of the same ester radical, of chlorine or bromine in addition to fluorine, to remedy this state of things, is limited by the steric hindrance of these atoms.

Table 1 however shows the advantage of halogen atoms, especially of chlorine and bromine, which absorb X-rays, the absorption at one wavelength by an atom masking the absorption discontinuity at this same wavelength of another atom.

It is then advantageous to associate several halogen atoms in the same polymer molecule, the absorption discontinuity of one atom, at one wavelength, being compensated for by the absorption of the other atoms, at the same wavelength. Since the steric hindrance of the halogens does not allow several halogens being fixed on the same radical, the composition forming the subject matter of the invention is a co- or terpolymer, obtained from at least two of three monomers the first of which comprises at least one fluorinated radical, the second at least one chlorinated radical and the third at least one brominated radical.

The radiation-sensitive composition of the invention is then an alkylacrylate-based polymer of the general formula:

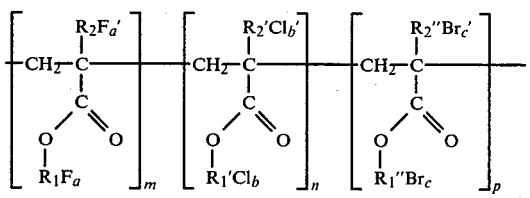

If one of the numbers m, n, p is equal to zero, the composition is a copolymer.

If none of the numbers m, n, p is equal to zero, the composition is a terpolymer.

The advantage of such compositions is twofold:

On the one hand, the presence of halogen atoms brings about an increase in sensitivity to soft X radiation (4 to 50 Å) in relation to conventional positive polymers such as methyl polymethacrylate. This may be ascribed to the absorbing power of the halogens which is greater than that of hydrogen, carbon and oxygen, as is shown in Table 2, which gives the absorption coefficients per unit of mass of these bodies, in comparison to those of halogens, for different wavelengths (in this table are also shown for each line of emission the nature of the anticathode which produced it and the name of the line: aluminum anticathode, line $K\alpha_{1,2}$ at 8.34 Å).

TABLE 2

| $\frac{\mu}{\rho}$ (cm²/g) | H | C | O | F | Cl | Br |
|---|---|---|---|---|---|---|
| 4.37 A (Pd, $L\alpha_1$) | — | 97.5 | 235.6 | 388.1 | 1906 | 1541 |
| 5.41 A (Mo, $L\alpha_1$) | — | 182 | 439.5 | 630.7 | 292.5 | 2741 |
| 8.34 A (Al, $K\alpha_{1,2}$) | 1.8 | 718.4 | 1597 | 2037 | 1023 | 1021 |
| 13.3 A (Cu, $L\alpha_{1,2}$) | 8.9 | 2714 | 5601 | 6941 | 3596 | 3101 |
| 16.0 A (Co, $L\alpha_1$) | 16 | 4451 | 8877 | 10910 | 5750 | 4671 |
| 21.6 A (Cr, $L\alpha_{1,2}$) | 43.4 | 9902 | 18740 | 1344 | 12100 | 8975 |
| 27.4 A (Ti, $L\alpha_{1,2}$) | 96.7 | 17960 | 1756 | 2490 | 20570 | 14360 |
| 44.7 A (C, $K\alpha$) | 472.7 | 2373 | 6044 | 8730 | 50760 | 32550 |

On the other hand, the interpolymer - copolymer or terpolymer - nature of these resins enables the spectral sensitization range to be extended in the region of the absorption discontinuities of each of the halogens, especially of those situated in the wavelength range between 4 and 50 Å.

In addition to their high sensitivity, these resins have good coating properties and notable adhesion, which favors their use for making high-definition masks.

FIRST SYNTHESIS EXAMPLE

The halogenated compositions were prepared by copolymerization or terpolymerization of mono- or poly-fluorinated, chlorinated, brominated monomers. Particularly interesting as monomers are those whose radical is ethylmonohalogenated:

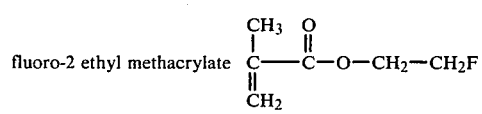

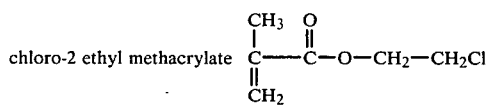

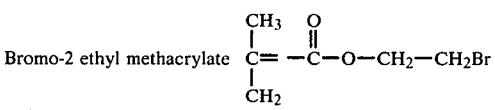

Their synthesis is carried out either by direct esterification of methacrylic acid by means of the corresponding halogenated alcohol, or by acylation of this alcohol by means of methacryloyl chloride, i.e. either

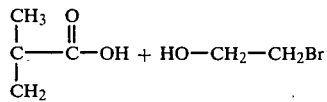

or

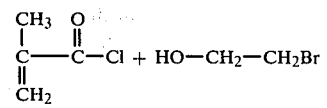

Br being able to be replaced by F or Cl, depending on the type of halogenated derivative desired.

The preparation of the interpolymers is then undertaken by mixing these monomers in an adequate solvent, for example benzene. A polymerization catalyst giving rise to free radicals is added: benzoyl peroxide. The mixture is heated to 80° C. for 48 hours. After cooling, the copolymers or terpolymers are isolated by precipitation in methanol.

Other polymerization catalysts giving rise to free radicals may be used: 2,2-azo-bis-(isobutyronitrile)

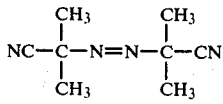

gives excellent results.

EXAMPLE OF APPLIED SYNTHESIS

This example is relative to the copolymerization of fluoro-2 ethyl methacrylate and of chloro-2 ethyl methacrylate in relative molar proportion 1/1.

0.018 g (0.05% of the total mass) of benzoyl peroxide were dissolved in a benzene solution (21.9 g i.e. 25 cm$^3$) containing 6.6 g (0.05 mole) of fluoro-2 ethyl methacrylate and 7.42 g (0.05 mole) of chloro-2 ethyl methacrylate, both being distilled beforehand. The solution was heated to reflux of the reaction mass for 48 hours. After cooling, it was diluted with 50 cm$^3$ of acetone then poured into methanol (2 liters). The copolymer which was precipitated was collected by filtration, washed with methanol then vacuum-dried for 96 hours. 9.3 g of dry product were obtained thus representing a transformation rate of 66.3%.

SECOND SYNTHESIS EXAMPLE

The composition was prepared by copolymerization or terpolymerization of α-(halogenoalkyl) alkyl- or halogenoalkyl acrylates.

Among the interesting α-(halogenoalkyl) acrylates, the following may be mentioned:

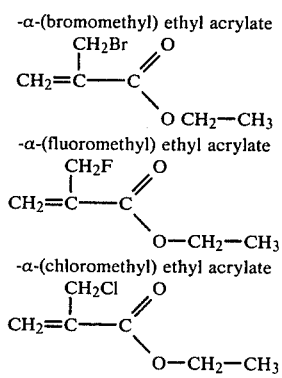

The synthesis of these monomers required several steps which appear in the reaction diagram reproduced in Table 3. It is to be noted that the fluorinated and chlorinated compounds were obtained from the brominated monomer.

TABLE 3

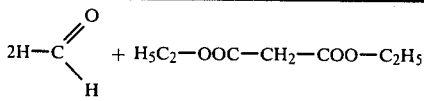

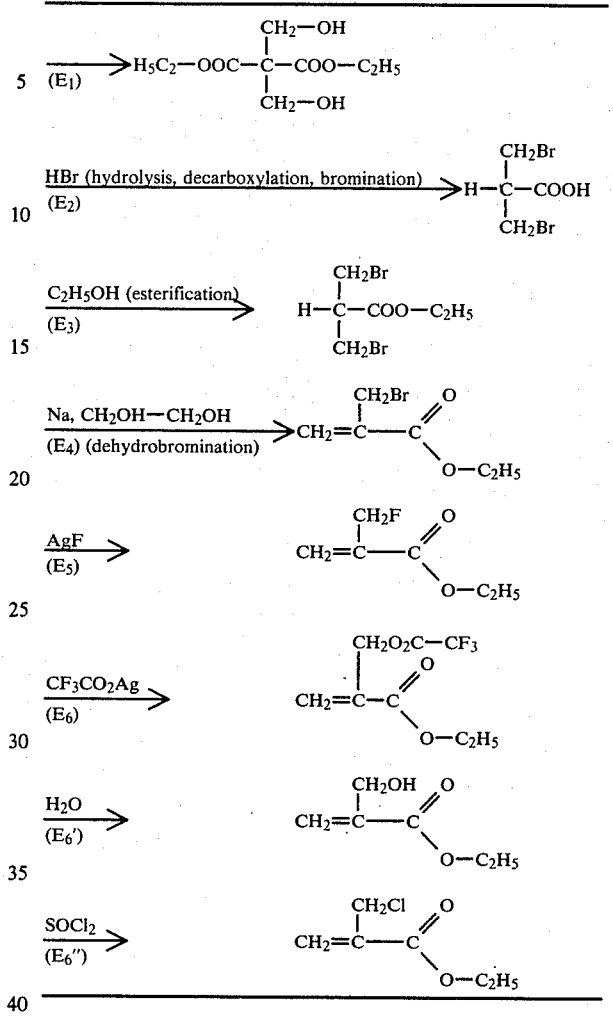

Steps $E_1$ to $E_4$, for the synthesis of the brominated monomer, consist in:

($E_1$): preparing bis (hydroxymethyl) diethyl malonate by condensation of formol and diethyl malonate;

($E_2$): forming β, β'-dibromoisobutyric acid by action of H Br on bis-(hydroxymethyl) diethyl malonate;

($E_3$): esterifying the acid with ethanol to form β, β'-ethyl dibromoisobutyrate;

($E_4$): dehydrobrominating the ester thus obtained by means of sodium glycolate ethylene causing the formation of α-(bromomethyl) ethyl acrylate.

Step $E_5$, for the fluorinated monomer consists in substituting fluorine for bromine by action of silver fluoride, causing the formation of α-(fluoromethyl) ethyl acrylate.

Steps $E_6$, $E_6'$, $E_6''$ for the chlorinated monomer consist in:

($E_6$): causing silver trifluoroacetate to act on α-(bromomethyl) ethyl acrylate, causing the formation of α-(trifluoroacetoxymethyl) ethyl acrylate;

($E_6'$): hydrolysing this compound to form α-(hydroxymethyl) ethyl acrylate;

($E_6''$): causing thionyl chloride to act on α-(hydroxymethyl) ethyl acrylate to form α-(chloromethyl) ethyl acrylate.

From these monomers, halogenated monomers are additionally obtained on the ester radical by transesterification from the corresponding halogenated alcohols by using usual catalysts in a reaction of this type.

The copolymerization or terpolymerization of these monomers is then achieved by mixing them in an adequate solvent, for example benzene. A polymerization catalyst giving rise to free radicals is added: benzoyl peroxide. This mixture is heated to 80° C. for 48 hours. After cooling, the polymers formed are isolated by precipitation in a non-solvent, for example methanol.

Other polymerization catalysts giving rise to free radicals may be used, for example 2,2 azo-bis-isobutyronitrile.

EXAMPLE OF APPLIED SYNTHESIS

The following synthesis example is relative to the preparation of copolymer of α-(fluoromethyl) ethyl acrylate and α-(bromomethyl) ethyl acrylate in relative molar proportion 1/1.

0.019 g (0.05% of the total mass) of benzoyl peroxide was dissolved in a benzene solution (21.9 g i.e. 25 cm$^3$) containing 6.6 g (0.05 mole) of α-(fluoromethyl) ethyl acrylate and 9.65 g (0.05 mole) of α-(bromomethyl) ethyl acrylate, both previously distilled. The solution was heated to reflux of the reaction mass for 48 hours. After cooling, it was diluted with 50 cm$^3$ of acetone then poured into methanol (2 liters). The copolymer which precipitated was collected by filtration, washed with methanol then vacuum-dried for 96 hours. The mass of dry product obtained corresponded to a transformation rate of the order of 50%.

The process for using compositions of the invention is particularly simple, and conforms to the norms of the man skilled in the art. When they are used as an image-transfer material, they are dissolved in a solvent of the methyl-4 pentanone-2 type, then deposited in a thin film typically 0.5 to 1 micron, by centrifugation on a substrate, such as a silicon wafer.

After heating to an optimum temperature, for eliminating the residual solvent and increasing the adhesion of the layers, the samples are irradiated with a view to causing chain splitting, so to make these resins more soluble in an appropriate developing mixture.

Different radiations may be used, not only of the electronic but also of the photonic type: gamma radiation emitted for example by conventional sources such as $_{55}^{137}$Cs or $_{27}^{60}$Co; "far" ultraviolet radiation (200 < λ < 300 nm); X radiation, especially "soft" X radiation (4 < λ < 50 Å) either continuous (synchrotron radiation in a storage ring) or coming from the emission of characteristic lines.

FIRST EXAMPLE OF USE

This example relates to the use of the previously-mentioned copolymer: fluoro-2 ethyl methacrylate, chloro-2 ethyl methacrylate as masking material when irradiating with soft X-rays.

This composition is dissolved in methyl-4 pentanone-2 (MIBK) so as to obtain a 10% solution by weight. A silicon wafer is then coated, by centrifugation, with a film of resin.

With a rotational speed of 3500 rpm a film of about 0.5 micron thickness is obtained. The sample is reheated to 180° C. for 30 minutes so as to eliminate the residual solvent. It is then irradiated in a vacuum by X-rays of a wavelength of 8.34 Å (A1 anticathode) through a mask. The length of irradiation time is optimized so as to obtain complete dissolution of the resin layer in the irradiated zones, after developing in the (MIBK) mixture (1 part in volume) - isopropanol (1 part in volume), 1 minute at 30° C.

SECOND EXAMPLE OF USE

The following example of use relates to the use of the previously-mentioned copolymer: α-(fluoromethyl) ethyl acrylate - α(bromomethyl) ethyl acrylate as masking material when irradiating with soft X-rays. This copolymer is dissolved in methyl-4 pentanone-2 so as to obtain a 15% solution by weight from which it is deposited in a thin film (0.5 microns in thickness) by centrifugation on a surface-oxidized silicon chip.

The chip covered with the thin film is reheated to 180° C. for 30 minutes to eliminate the residual solvent. It is then irradiated in a vacuum by X-rays of a wavelength of 21.6 Å (Cr anticathode) through a mask. The length of irradiation time is "optimized" so as to obtain complete dissolution of the resin layer in the irradiated zones after developing.

More generally, the manufacturing masks obtained by means of such a composition degradable under the action of a radiation, form part of the invention.

such masks are used in microelectronics, for manufacturing electronic components, especially integrated circuits.

They may also be used in integrated optics for manufacturing optoelectronic components.

It is apparent that within the scope of the invention, modifications and different arrangements can be made other than is here disclosed. The present disclosure is merely illustrative with the invention comprehending all variations thereof.

What is claimed is:

1. A photomasking composition, degradable under the action of a radiation, formed from α-alkylacrylic type copolymers substituted by at least two types of halogen atoms, having the general formula:

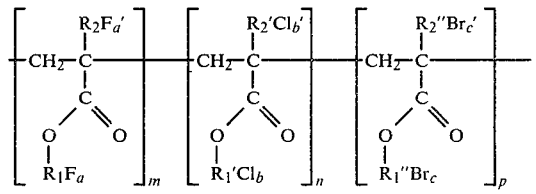

in which:
R$_1$, R$_1'$, R$_1''$, R$_2$, R$_2'$, R$_2''$ designate alkyl radicals whose principal chain contains 1 to 10 carbon atoms;
these radicals being substituted by fluorine, chlorine, bromine whose indexes a, a', b, b', c, c' are whole, positive or zero numbers;
m, n, p designate whole numbers, equal to or greater than zero, a single one of the three numbers m, n, p being able to be equal to zero.

2. The composition as claimed in claim 1, consisting of a copolymer of alkylacrylates substituted by fluorine and chlorine (p=0).

3. The composition as claimed in claim 1, consisting of a copolymer of alkylacrylates substituted by fluorine and bromine (n=0).

4. The composition as claimed in claim 1, consisting of a copolymer of alkylacrylates substituted by chlorine and bromine (m=0).

5. The composition as claimed in claim 1, consisting of a terpolymer of alkylacrylates substituted by fluorine, chlorine and bromine (m, n, p$\neq$0).

6. The composition as claimed in claim 1, consisting of a copolymer of α-(halogenoalkyl) alkyl or halogenoalkyl acrylates substituted by fluorine and chlorine (p=O).

7. The composition as claimed in claim 1, consisting of a copolymer of α-(halogenalkyl) alkyl or halogenoalkyl acrylates substituted by fluorine and bromine (n=O).

8. The composition as claimed in claim 1, consisting of a copolymer of α-(halogenoalkyl) alkyl or halogenoalkyl acrylates substituted by chlorine and bromine (m=O).

9. The composition as claimed in claim 1, consisting of a terpolymer of α-(halogenoalkyl) alkyl or halogenoalkyl acrylates substituted by fluorine, chlorine and bromine (m, n, p$\neq$O).

10. The composition as claimed in any one of claims 1 to 9, containing a positive resin, degradable under the action of an irradiation.

11. The composition as claimed in claim 1, which is sensitive to and degradable by electrons.

12. The composition as claimed in claim 1, which is sensitive to and degradable by "far" ultraviolet rays (200<$\lambda$<300 nm).

13. The composition as claimed in claim 1, which is degradable by "soft" X-rays (4<$\lambda$<50 Å).

14. The composition as claimed in claim 1, which is sensitive to and degradable by gamma radiation.

15. The composition as claimed in claim 13, wherein its sensitivity to X-rays is greater than that of the corresponding homopolymers, the absorption discontinuities of a first halogen being compensated for by the absorption of the other halogens, at the wavelength of the discontinuity of the first halogen.

16. A process for preparing the photomasking composition as claimed in any one of claims 1 to 15, consisting in copolymerizing at least two of the three fluorinated, chlorinated, brominated alkylacrylate derivatives by heating in the presence of polymerization catalysts, of the type giving rise to free radicals.

17. A manufacturing mask obtained by means of a photomasking composition such as claimed in any one of claims 1 to 15, which is degradable under the action of one of the following radiations: gamma, X, ultraviolet, electron.

* * * * *

UNITED STATES PATENT AND TRADEMARK OFFICE
CERTIFICATE OF CORRECTION

PATENT NO. : 4,268,590
DATED : May 19, 1981
INVENTOR(S) : Armand Eranian et al.

It is certified that error appears in the above—identified patent and that said Letters Patent is hereby corrected as shown below:

ON THE TITLE PAGE:

Please correct the Priority Data to read as follows:

[30] - Foreign Application Priority Data

March 9, 1979 [FR] France 79 06136 should read:

[30] - Foreign Application Priority Data

March 9, 1979 [FR] France 06136 and

July 17, 1979 [FR] France 79 18467

Signed and Sealed this

Eleventh Day of May 1982

[SEAL]

Attest:

GERALD J. MOSSINGHOFF

Attesting Officer   Commissioner of Patents and Trademarks